US006173674B1

(12) United States Patent
DeOrnellas et al.

(10) Patent No.: US 6,173,674 B1
(45) Date of Patent: *Jan. 16, 2001

(54) PLASMA REACTOR WITH A DEPOSITION SHIELD

(75) Inventors: Stephen P. DeOrnellas, Santa Rosa; Robert A. Ditizio, Petaluma, both of CA (US)

(73) Assignee: Tegal Corporation, Petaluma, CA (US)

( * ) Notice: Under 35 U.S.C. 154(b), the term of this patent shall be extended for 0 days.

This patent is subject to a terminal disclaimer.

(21) Appl. No.: 09/434,092

(22) Filed: Nov. 5, 1999

Related U.S. Application Data

(63) Continuation of application No. 09/204,020, filed on Dec. 1, 1998, now Pat. No. 6,006,694, which is a continuation-in-part of application No. 08/985,730, filed on Dec. 5, 1997.

(51) Int. Cl.[7] .............................. C23C 16/00; H05H 1/00
(52) U.S. Cl. .................. 118/723 I; 118/723 AN; 156/345
(58) Field of Search .................. 118/723 I, 723 AN, 118/723 E, 723 R, 723 VE; 156/345; 204/111.21, 111.51

(56) References Cited

U.S. PATENT DOCUMENTS

| 4,033,287 | 7/1977 | Alexander, Jr. et al. ....... 118/49.1 R |
| 5,277,751 | 1/1994 | Ogle ...................................... 156/643 |
| 5,445,709 | 8/1995 | Kojima et al. ......................... 216/71 |
| 5,800,619 | 9/1998 | Holland et al. ...................... 118/723 |
| 5,814,154 | 9/1998 | Boitnott .............................. 118/723 |
| 5,846,331 | * 12/1998 | Miyamoto ....................... 118/723 R |
| 5,874,704 | 2/1999 | Gates ............................. 219/121.43 |
| 5,968,275 | * 10/1999 | Lee et al. ........................ 118/723 R |

OTHER PUBLICATIONS

PCT Notification of Transmittal of the International Search Report or the Delcaration for PCT/US98/25437, Int'l Filing Date Dec. 1, 1998, mailed Mar. 19, 1999.
Alan R. Reinberg, *Plasma Etch Equipment Technology, M. Triodes*, Perkin–Elmer Corporation, Norwalk, Connecticut, ©1989 by Academic Press, Inc., ISBN–0–12–469370–9; pp. 350–351.
Plasma Etching Technology, Feb. 10–11, 1997, Burlingame, California, Continuing Education in Engineering, University Extension, U.of California, Berkeley,*Plasma Etching Technology An Overview*, D.L. Flamm, D.L. Flamm 1992–1996, title95011501v2, D.L. Flamm 1995, src5012608, 3 pgs.

* cited by examiner

*Primary Examiner*—Gregory Mills
*Assistant Examiner*—Parviz Hassanzadeh
(74) *Attorney, Agent, or Firm*—Fliesler, Dubb, Meyer & Lovejoy

(57) ABSTRACT

A reactor 20 includes a shield 50 which prevents the deposition of materials along a line-of-sight path from a wafer 26 toward and onto an electrode 32, or a window 38 which couples an electrode 32 to a reaction chamber of the reactor 20. The shield can be comprised of a conductor and/or an insulator. The shield can affect the character of a plasma generated in the reactor.

26 Claims, 6 Drawing Sheets

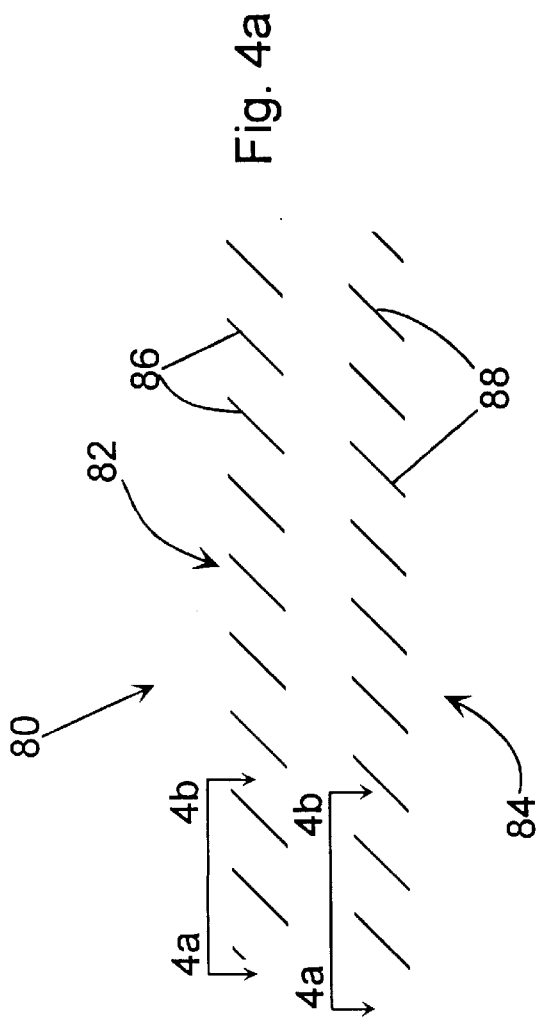
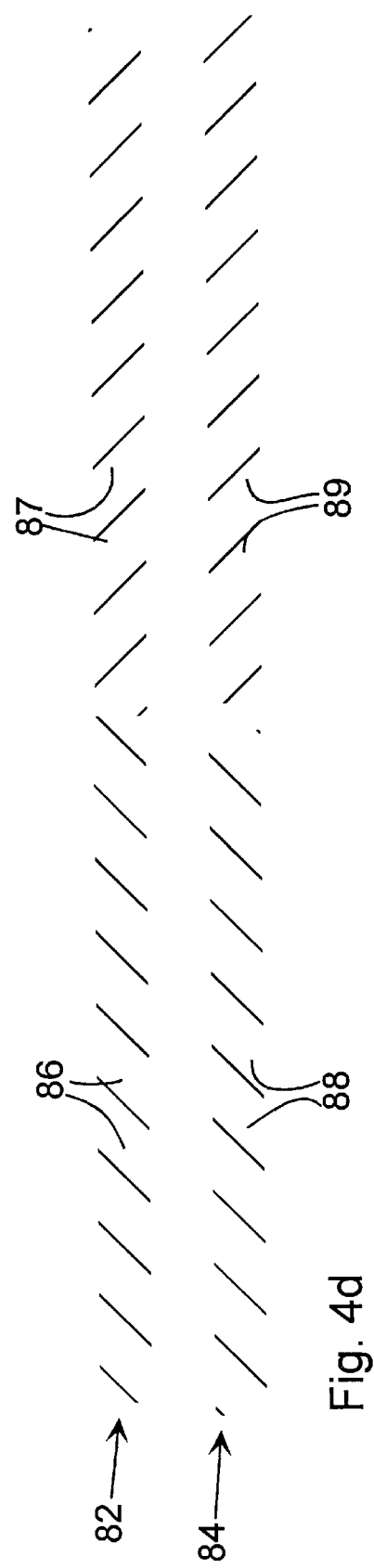

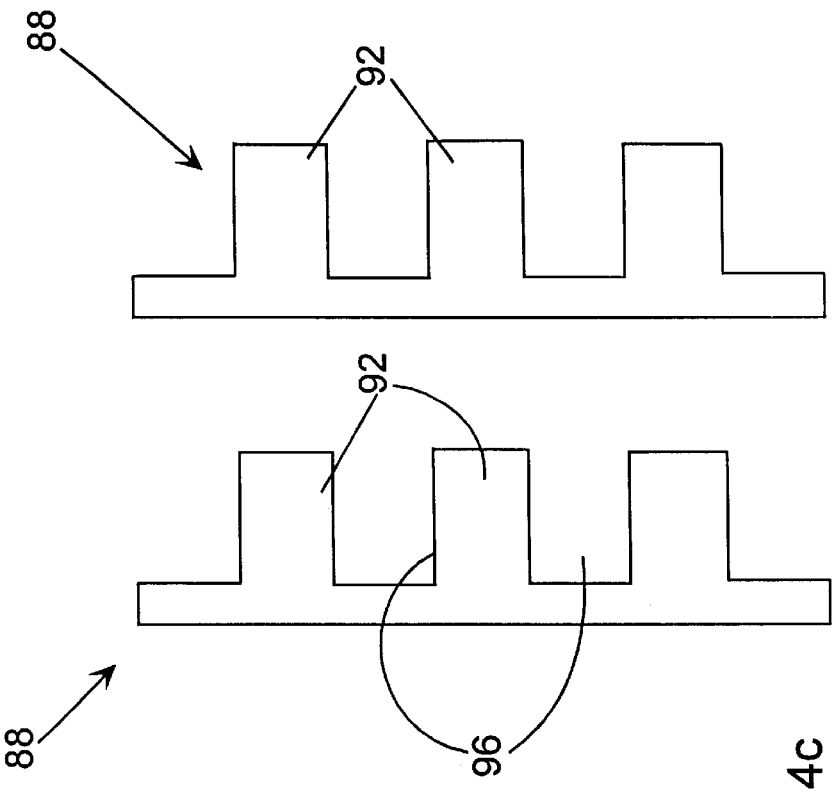
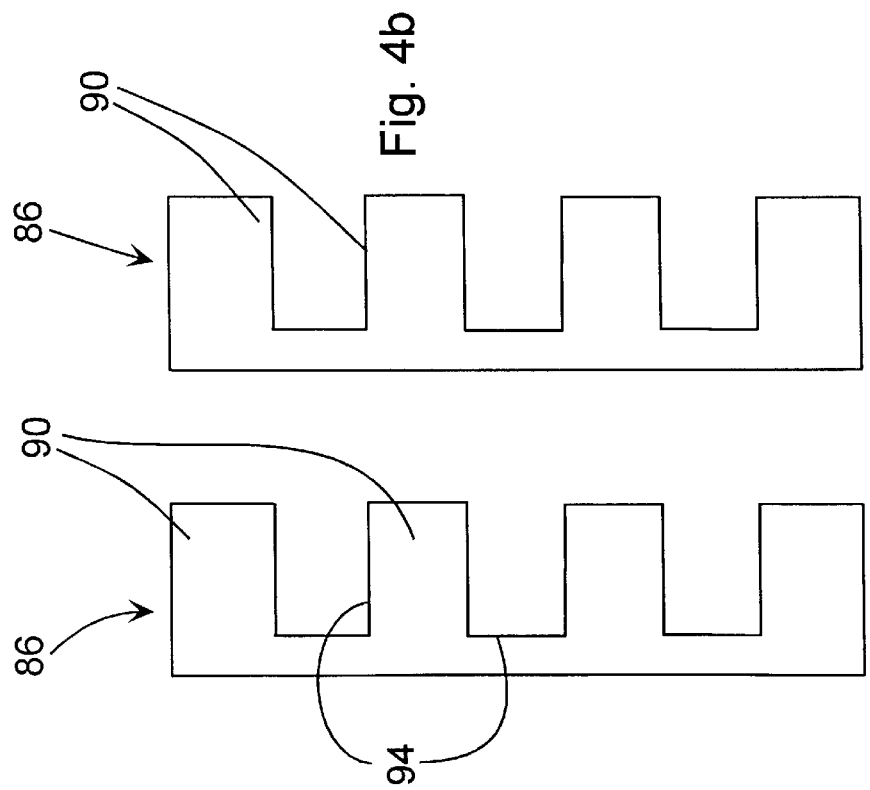
Fig. 4b
Fig. 4c

PLASMA REACTOR WITH A DEPOSITION SHIELD

This application is a continuation of Ser. No. 09/204,020, filed Dec. 1, 1998, now U.S. Pat. No. 6,006,694, which is a continuation-in-part of Ser. No. 08/985,730, filed Dec. 5, 1997.

FIELD OF THE INVENTION

The present invention is directed to a semiconductor processing reactor and in particular to a reactor which causes material to sputter from the wafer being processed.

BACKGROUND OF THE INVENTION

During semiconductor fabrication processes including but not limited to etch processes, material from a wafer may have a tendency to sputter therefrom and deposit on various surfaces, including but not limited to cooler surfaces, of a reactor such as the walls of a reactor. Inductively coupled plasma reactors generally have a first power electrode which can be in the shape of a inductive coil which is coupled to the reactor chamber through a window which is generally comprised of quartz. In such an arrangement, material sputtered from a wafer and traveling in a direct line-of-sight, can strike and build-up on the various surfaces of the reactor including the walls and the window. Such deposits caused by sputtering and other mechanisms can adversely affect the operation of the reactor. The build-up of such materials means that the reactor must be periodically shut down and the various surfaces are either cleaned or replaced. Accordingly, there is a need to minimize the effect of material sputtered from the wafer surface, which is deposited on the walls and window of the reactor. Further, there is a need to minimize the effect of materials deposited by any mechanism on the walls, windows, and other surfaces of a reactor.

SUMMARY OF THE INVENTION

The present invention is directed to overcome the disadvantages of the prior art. In particular, the present invention is advantageously useful for semiconductor wafer processing operations that cause materials to sputter from the surface of a wafer. In particular, in the case of a inductively coupled plasma reactor having an electrode in the form of an inductive coil coupled to the reactor chamber through a power transfer window, deposited materials, including but not limited to metals and other materials deposited by sputtering and other mechanisms, could impinge and collect upon the window reducing or eliminating the power coupling from the inductive electrode.

Accordingly, it is an object of the present invention to provide a mechanism whereby the sputtering of the materials from the wafer does not reduce or eliminate the power coupling from the inductive electrode or any other electrodes.

It is another object of the present invention to provide a deposition shield that prevents the deposition of materials on a power transfer window or an electrode. Deposition could occur through mechanisms such as sputtering, condensation, and the like.

It is another object of the present invention to provide a deposition shield to intercept material sputtered from the wafer surface that is directed toward the electrode and/or the window which couples the electrode to the reaction chamber.

It is a further object of the present invention to provide a deposition shield that is in the direct line-of-sight or sputter path between the wafer and the electrode or window.

It is a further object of the present invention to provide for a reactor which has a longer operational mean time between shutdown for maintenance and cleaning.

Yet a further object of the present invention is to provide a shield which is comprised of material which affects the character of a plasma formed in the reactor.

Yet another object of the present invention is to provide a shield which is comprised of one of a conductor and non-conductor such as an insulator.

Still a further object of the present invention is to provide a shield which allows an electrical field to continue through the shield from a first chamber to a second chamber where a wafer is held by a chuck.

Yet another object of the present invention is to provide a shield comprised of, by way of example only, conductors such as aluminum, annodized aluminum, carbon (graphite), and carbon based compounds containing graphite.

In still a further object of the present invention, the shield is comprised of an insulator including, by way of example only, one of alumina, quartz, teflon, delrin, nylon, polyimide, and a support structure coated with an organic compound, and generally carbon based compounds (plastics).

Still a further object of the present invention is to provide a shield which protects a wafer held on a chuck in a second chamber from generation of a plasma.

In accordance with the invention, a plasma reactor includes an electrode which is used to create a plasma and a reactor chamber. The reactor includes a chuck that is adapted to hold the wafer, which chuck is located in the reactor chamber. The reactor further includes a deposition shield which is located in the reactor chamber in the line-of-sight path between the wafer and the electrode.

In another aspect of the invention, the deposition shield includes a plurality of louvers or slats.

In a further aspect of the invention, the deposition shield includes a plurality of overlapping louvers or slats which block the line-of-sight path between the wafer and the electrode in order to block the path of materials removed from the wafer, by methods including but not limited to sputtering, and directed toward the electrode.

In yet a further aspect of the invention, the plasma reactor is an inductively coupled plasma reactor and the reactor includes a window which shields the electrode from the reactor chamber. The deposition shield prevents materials from being deposited onto the window and thereby reducing or eliminating the power coupling from the inductive electrode which is coupled through the window to the reactor chamber.

In another aspect of the invention, the shield is comprised of material which affects the character of the plasma.

In still another aspect of the invention, the shield is comprised of one of a conductor and an insulator.

In another aspect of the invention, the plasma reactor includes a tri-electrode reactor with a first electrode located at the top of the reactor, a second electrode located about the periphery of the chamber, and a third electrode located at the bottom of the chamber and associated with the chuck which holds a wafer. The top electrode can include, by way of example only, a capacitively coupled electrode.

In another aspect of the invention and in particular with an inductively coupled plasma reactor, a device is provided for preventing the reduction or elimination of the power coupling of a inductive electrode, which is coupled to the reactor chamber through a window.

In another aspect of the invention, the deposition shield allows for effective operation of ICP (Inductively Coupled Plasma) systems and ECR (Electron Cyclotron Resonance) systems.

Other aspects, objects and advantages of the invention will be evident from a review of the specification, the claims and the appended drawings.

BRIEF DESCRIPTION OF THE FIGURES

FIGS. 4a, 4b, 4c, and 4d depict further alternative embodiments of the deposition shield of the invention.

DETAILED DESCRIPTION OF THE PREFERRED EMBODIMENT

Figure 1A:
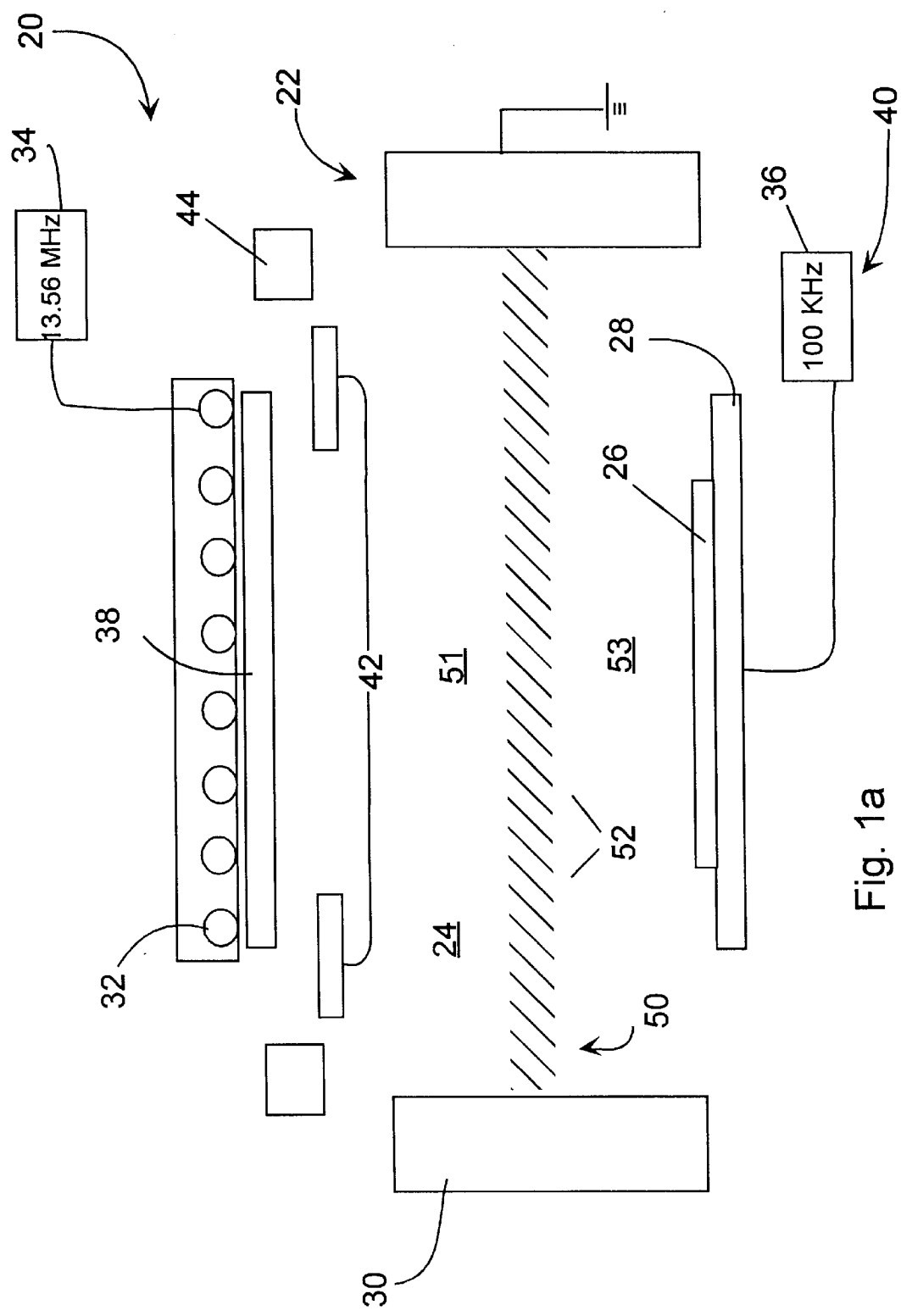
FIGS. 1a, 1b, and 1c depict a representative inductively coupled plasma reactors incorporating embodiments of the deposition shield of the invention.
Figure 1B:
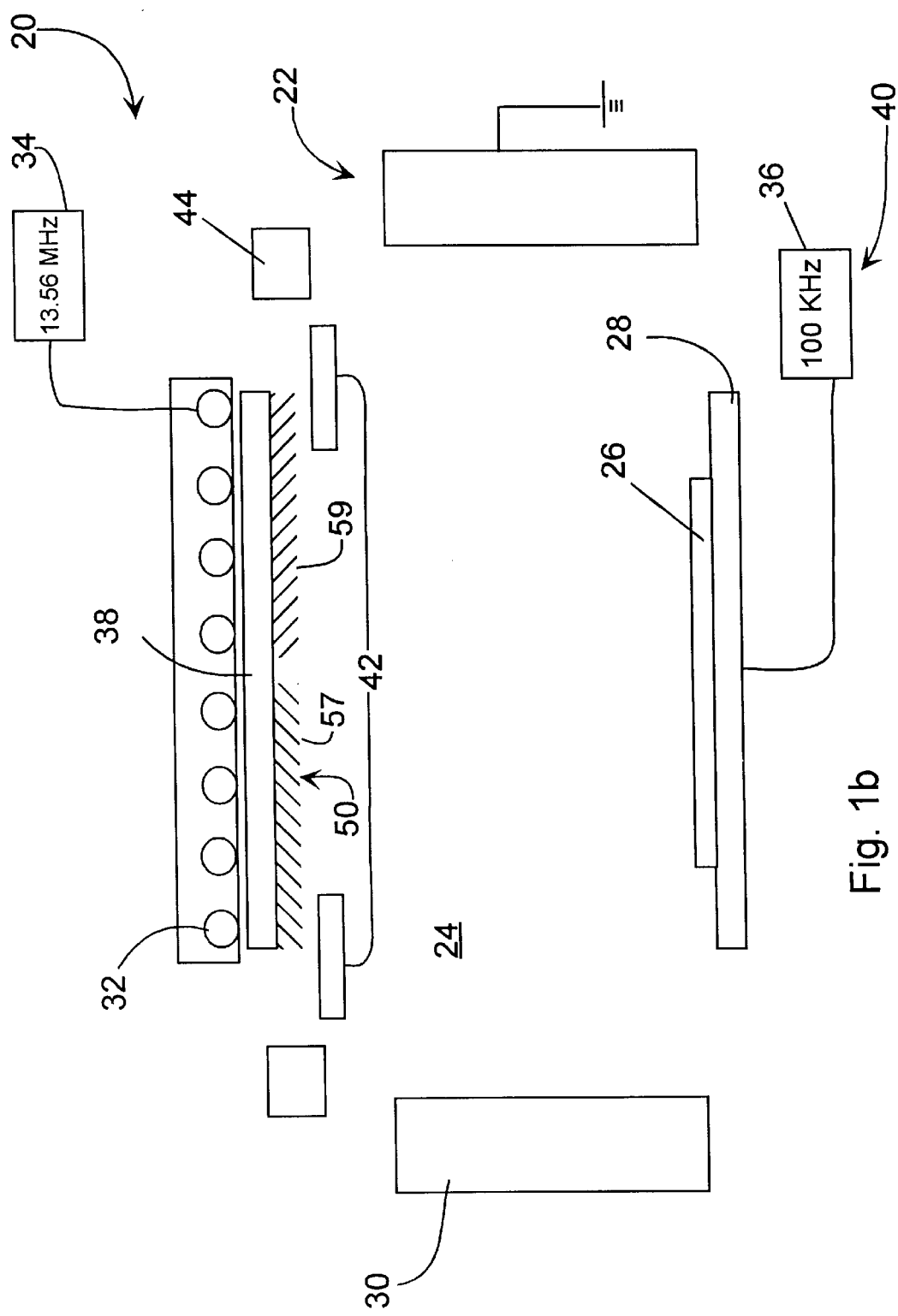
Figure 1C:
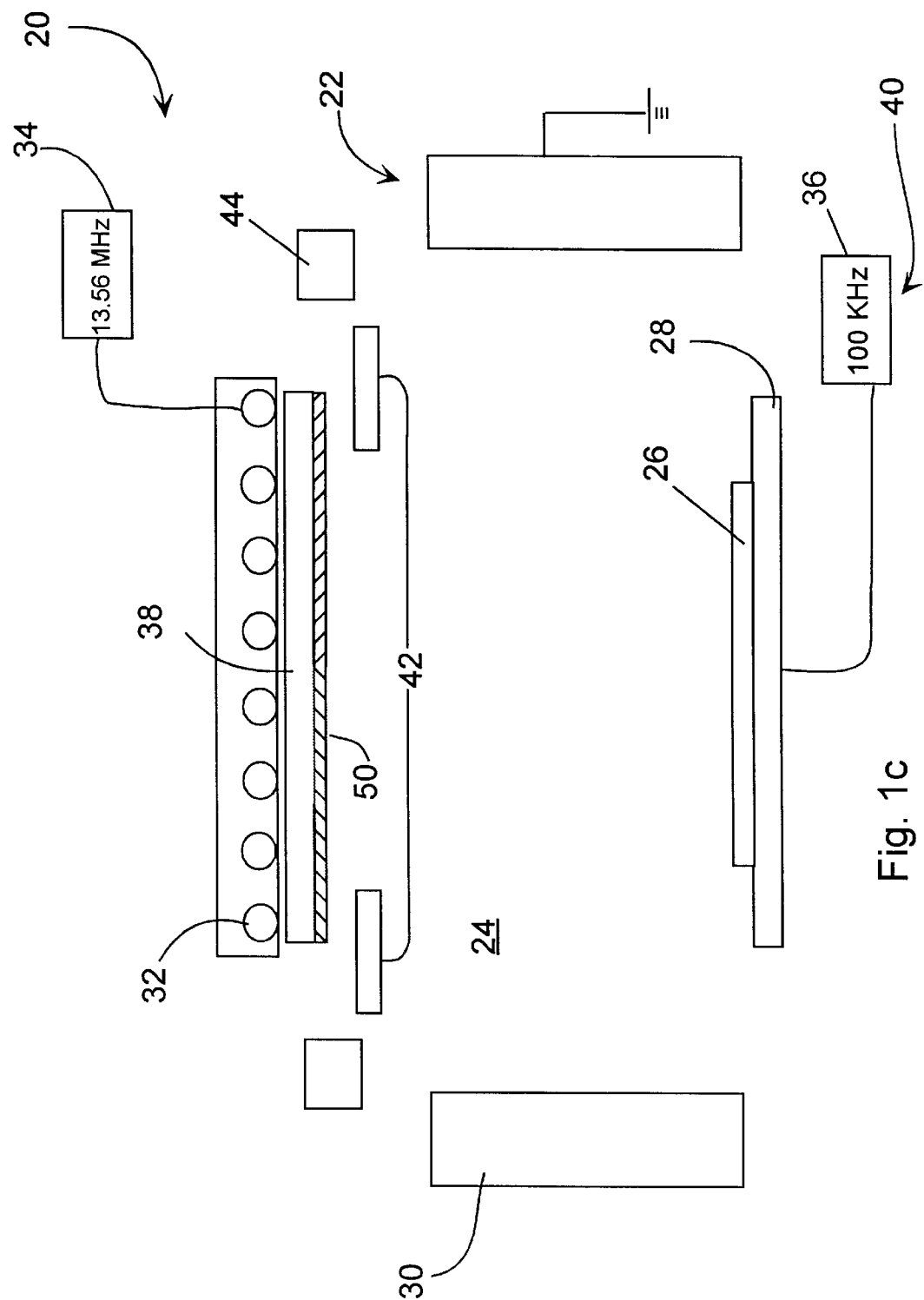

FIGS. 1a, 1b, and 1c depict a plasma reactor 20 of the present invention. The plasma reactor in this particular embodiment is an inductively coupled plasma reactor. It is to be understood that the essence of the invention can be practiced in other types of reactors such as ECR, Helicon and other ICP reactors as well as capacitively coupled reactors. Thus, the invention is advantageous for any variety of reactors which can perform a variety of operations and which can cause the deposition of materials from the surface of a wafer onto other surfaces such as a power transfer window. The reactor 20 configured in this embodiment to perform an etching process. The reactor 20 includes a housing 22 and a reactor or etched chamber 24. A wafer 26 is positioned on a chuck incorporated with a bottom electrode 28. The chamber 24 further includes a side peripheral electrode 30 which can be grounded or allowed to establish a floating potential as a result of the plasma developed in the chamber 24. The reactor 20 includes an upper electrode 32 which in this embodiment includes an inductor coil.

Preferably, the reactor 20 includes two A.C. power sources. A first power source 34 is connected to the upper electrode 32 and a second power source 36 is connected to the bottom electrode 28. Appropriate circuitry for both connections may include matching networks. Further, a controller 40 controls the sequencing of the first and second AC power source 36, 38. In this embodiment, the first power source 34 is operated in the megahertz range, and preferably operates at about 13.56 MHz although other frequencies in the MHz and GHz range can be used with the present invention. The second power source 32 preferably operates in the KHz range and is optimally operated at about 450 KHz and generally in the range that is less than about 500 KHz. However, the second power supply can also be operated into the MHz range. It is to be understood that ion energy increases toward the KHz range while ion density increases toward the MHz range. Further, the wafer electrode can have applied thereto mixed frequency power supplies such as power supplies in the KHz and MHz ranges, or in the KHz and GHz ranges. The present embodiment further includes a process gas inlet head 42 and process gas outlet port 44. While the reactor chamber of FIGS. 1a, 1b, and 1c depict top pumped systems, it is to be understood other reactor systems which have process gas inlet and outlet ports in various other locations of the reactor system, including but not limited to ports associated with a bottom chuck electrode, can benefit from the present invention.

A power transfer window 38, which is generally comprised of quartz or any other material which allows the power that is transferred through the inductive coil of upper electrode 32 to be coupled to the reactor chamber 24, is positioned adjacent to the inductive upper electrode 32.

The invention further includes a shield 50 which in the present embodiment includes a plurality of louvers or slats 52 which are positioned at a skewed angle with respect to the wafer 26 and the bottom electrode 28. This shield can prevent the deposition of materials onto the power transfer window 38 so that power coupling with the electrode 32 through the window is not reduced or eliminated. The deposition of materials can occur from a number of mechanism such as sputtering, condensation, and the like. Although reference is made below to sputter shields, such shields can prevent deposition by any of said number of mechanisms.

In this embodiment of FIG. 1a, the shield 50 interrupts a line-of-sight sputter path between a material sputtered from the wafer 26, and the window 38 and the induction coil 32. A particular sputter shield 50 includes louvers 52 which overlap in order to block material sputtered from the wafer 26. In a preferred embodiment, the sputter shield 50 can be comprised of quartz, ceramic, or other insulating materials which are appropriate to the reactor chamber. Conductors can also be used for the shield. The sputter shield 50 can in fact be analogized to a set of Venetian blinds which have been partially opened. The sputter shield 50 prevents materials and in particular metals from metal film on a semiconductor wafer 26 from being sputtered and deposited on the window 38. Such metals could reduce or eliminate the coupling of power between the inductive coil of upper electrode 32 and the reactor chamber 24.

As can be seen in Fig. 1a, the deposition shield 50 is located in this preferred embodiment mid-way through the reactor chamber 24 in order to create an upper chamber 51 in which the plasma is developed and lower chamber 53 where the wafer is located and where the semiconductor processing occurs.

Thus, it is to be understood that with the shield positioned in FIG. 1a substantially divides the chamber to an upper chamber and a lower chamber that such a reactor operates much in the way that a downstream reactor operates. That is to say that while the shield prevents the sputtering or deposition of materials from the wafer back onto the coupling window of 32, the shield also protects the wafer from undesirable aspects of the plasma which could damage the wafer.

FIG. 1b depicts an alternative embodiment of the invention of FIG. 1a wherein the deposition shield is placed adjacent to the window 38. In this embodiment, the shield 50 is placed above where a plasma would normally form in the chamber and thus does not interfere with the formation of the plasma. However, the shield does prevent or greatly reduce the deposition of materials onto the window 38, which deposition would reduce or eliminate the power coupling of the power source through the window. As can be seen in FIG. 1b, the shield 50 includes a plurality of louvers 57, 59. The louvers 57 slopes somewhat leftwardly from a center of the induction coil 32 while the louvers 59 slopes somewhat rightwardly from the center of the induction coil 32.

FIG. 1c depicts yet a further embodiment of the present invention wherein the deposition shield 50 is incorporated into the window 38. Such incorporation can be for example provided when the window is made out of quartz and the deposition shield is provided through the formation of grooves directly into the window 38, with the grooves being directed much as the spaces between the louvers 57 and 59 of FIG. 1b are oriented. Additionally, it is possible to cause a deposition shield to be directly deposited on the window 38 in order to form a structure much as that shown in FIG. 1c wherein grooves are formed directly into the material of the window 38. By way of example only, a quartz window could be formed with the deposition of alumina thereupon in order to construct for example mini-louvers that would act as a deposition shield. Additionally, it is to be understood that other patterns can be deposited on the window in order to form a deposition shield and be within the spirit and scope of the invention. These patterns would cause portions of the window 38 to be out of the direct line of sight of the wafer 26.

Figure 2:
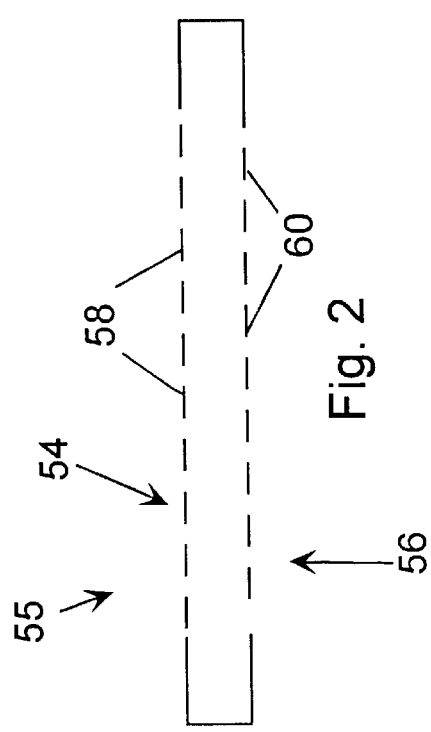
FIG. 2 depicts an alternative embodiment of the deposition shield of the invention.

Another embodiment of the deposition shield 55 of the invention can be seen in FIG. 2. This deposition shield 55 includes first and second courses 54, 56 of individual louvers or slats 58 and 60 respectively. The slats of the first and second courses 54, 56, are parallel to the wafer 26. The slats 58 of course 54 overlap the ends of the slats 60 of course 56. Such an arrangement provide a line-of-sight shield in order to prevent sputtered or other materials from impinging upon and depositing on the window 38 or in case of a capacitively coupled reactor, the upper electrode. The embodiment of the shield in FIG. 2 can be placed in any of the three locations depicted in FIGS. 1a, 1b, and 1c.

Figure 3A:
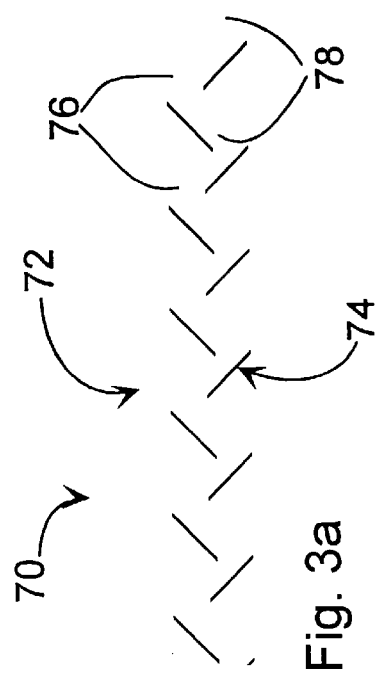
FIGS. 3a and 3b depict yet further alternative embodiments of the deposition shield of the invention.
Figure 3B:
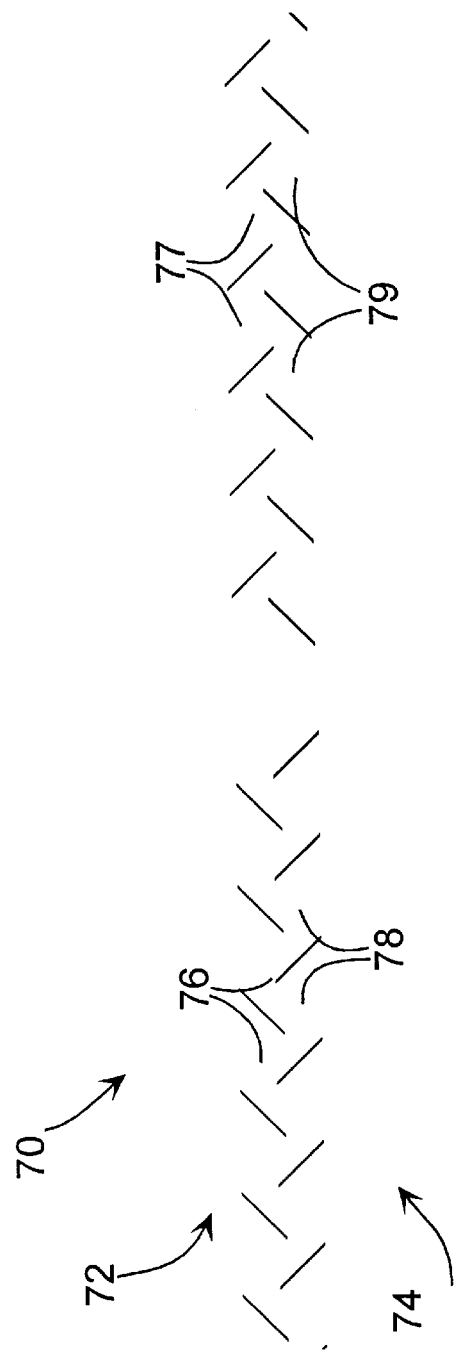

FIGS. 3a and 3b depict yet an alternative embodiment of the shield 70 of the invention. This shield includes first and second courses 72, 74 of louvers or slats 76, 78, respectively. The first course 72 includes a plurality of louvers or slats 76 which are parallel to each other and skewed with one orientation with respect to the wafer 26. The second course 74 includes the louvers or slats 78 which are parallel to each other and skewed in another direction with respect to the semiconductor wafer 26. In a preferred embodiment using the configuration of FIG. 3a the first course of slats 72 is skewed at an acute angle of about 45° and the second course 74 is skewed at an obtuse angle of about 135°. The ends of the slats 76, 78 overlap each other.

In FIG. 3b, an alternative embodiment of the shield 70 is depicted which includes first and second courses 72, 74 of louvers or slats which are configured somewhat like the louvers and slats shown in FIG. 1b. That is to say that the first course 72 includes louvers or slats 76 and 77 with louvers 76 directed somewhat leftwardly and louvers 77 directed somewhat rightwardly. A second course 74 includes louvers and slats 78 and 79 with louvers 78 directed somewhat rightwardly and louvers 79 directed somewhat leftwardly.

In yet a further embodiment of the invention shown in FIGS. 4a, 4b, 4c, and 4d. A shield 80 includes first and second courses 82, 84 of louvers or slats 86 and 88 respectfully. From the side view of FIG. 4a, the louver or slats look similar to those of FIG. 1 in that they are comprised of a plurality of parallel louvers or slats inclined at an acute angle with respect to bottom electrode 28. Turning to FIGS. 4b and 4c, it is evident that the louvers are specially configured, with material eliminated in certain areas, in order to have a plurality of tabs 90 with respect to louvers 86 and a plurality of tabs 92 with respect to louvers 88. The tabs 90 define spaces 94 located therebetween. Spaces 94 are blocked or shielded by the tabs 92 of the lower course 88. Similarly, the tabs 92 include spaces 96 located therebetween. These spaces 96 are shielded by the tabs 90 of the upper course 82. Accordingly, the embodiment of FIGS. 4a, 4b, and 4c, depict a deposition shield having a plurality of channels for the diffusion of etchants and other process gases from the upper chamber of FIG. 1a to the lower chamber so that these etchants and other process gases can react with the wafer.

With respect to FIG. 4d, this includes first and second course 82, 84. First course 82 includes slats 86, 87, and second course 84 includes slats 88, 89. As with the embodiment of FIG. 1b, slats 86 are somewhat leftwardly directed while slats 87 are somewhat rightwardly directed. Additionally, slats 88 are somewhat leftwardly directed while slats 89 are somewhat rightwardly directed. Such an arrangement is advantageous in order to prevent deposition of materials on the power transfer window 38.

With respect to FIGS. 4a and 4b, the shield 80 can be placed adjacent to or incorporated into the window in order to not interfere with the formation of the plasma therebelow in the chamber of the reactor, and afford deposition protection to the window in order to not reduce or eliminate the power coupling effect of the window.

The above FIGS. 1–4d depict variations of an advantageous shield of the invention. It is to be understood that the shield can be subject to wear and that it is designed to be replaceable, as are one or more of the electrodes of the reactor.

In all the above embodiments, the shield, such as shield 50, can be comprised of various materials, such as for example a conductor, and a non-conductor such as an insulator in order to affect the generation of plasma both. With the shield 50 consisting of a conductor, the electrical field generated by the electrodes do not penetrate the shield such that an electrical field is established in the upper chamber 51 and not in the lower chamber 53 of FIG. 1a. Additionally, adjusting the pressure and temperature of the chambers and the frequencies of the electrodes relative to the lower chamber would affect the plasma developed.

The shield of FIG. 1a can isolate the plasma generation to the upper chamber 51. The use of such a shield blocks energized ions and ultraviolet radiation, developed in the upper chamber, from damaging the wafer held in a chuck in the second chamber. The shield decouples the plasma generation which occurs in the upper chamber 51 from the etching operation which occurs in the lower chamber 53. Such an arrangement is like a downstream etch reactor where the plasma generation can be located distantly from the actual etch site in order to avoid wafer damage from energized ions and radiation such as ultraviolet radiation.

With a conductive shield 50 placed adjacent to the window 38 (FIG. 1b), plasma would form in the main chamber 57, below the deposition shield 50. As a plasma is formed below the shield, the shield does not interfere with the formation of plasma. Accordingly, there is no lessening of the plasma density with respect to the wafer 26.

A conductive shield can be comprised of a metal such as, by way of example only, aluminum, anodized aluminum, or carbon (graphite) or a carbon based compound containing graphite, or any other conductor which would not contaminate the wafer.

Alternatively, the shield in FIG. 1a can be comprised of an insulator which shields the second chamber from the plasma. Such an insulating shield enables the reactor to act as a downstream etcher.

Still alternatively, the shields of FIGS. 1b and 1c can be comprised of insulating materials. Further, the insulating shield positioned adjacent to the coupling window as indicated in FIG. 1b, can be incorporated into the coupling window as indicated in FIG. 1c.

The insulating shield can be comprised of a material such as for example alumina, quartz, silicon, teflon, delrin, nylon, polyimide, and carbon based compounds (plastics), and other organic materials. In addition, a nonorganic support structure can be covered with organic materials in order to form a shield.

It is to be understood that whenever any of the shields wear out, that the shields can be replaced with new shields.

INDUSTRIAL APPLICABILITY

The present invention is directed to providing a shield in order to ensure that the deposition of materials from a wafer does not reduce or eliminate the effectiveness of power transfer windows used with an electrode and/or the effectiveness of the reactor generally. The electrode can be used for example to create the plasma of the reactor.

Other features, aspects and objects of the invention can be obtained from a review of the figures and the claims.

It is to be understood that other embodiments of the invention can be developed and fall within the spirit and scope of the invention and claims.

We claim:

1. A reactor which can generate a plasma in order to process a semiconductor wafer, said reactor comprising:
   a power transfer window;
   a reactor chamber;
   a chuck that is adapted to hold a wafer, which chuck is located in the reactor chamber;
   a shield which is located in the reactor chamber in the line of sight path between the chuck and said power transfer window in order to minimize the deposition of materials from a wafer onto said power transfer window;
   wherein said shield is an integral part of said power transfer window; and
   said shield includes a multiplicity of spaced members adapted for deposition of materials thereon.
2. The reactor of claim 1 wherein:
   said shield is comprised of one of a conductor and an insulator.
3. The reactor of claim 1 wherein:
   said shield is a non-conductor which allows a magnetic field to continue through the shield.
4. The reactor of claim 3 wherein:
   said shield is comprised of one of alumina, quartz, and carbon based compounds.
5. The reactor of claim 1 wherein:
   wherein said shield is comprised one of alumina, quartz, silicon, polytetrafluorethylene, delrin, polyamide, and support a structure coated with an organic compound.
6. The reactor of claim 1 wherein:
   said shield is comprised of an organic compound.
7. The reactor of claim 1 wherein:
   said reactor is inductively coupled.
8. The reactor for claim 1 wherein:
   said multiplicity of spaced members includes a multiplicity of louvers.
9. The reactor of claim 1 wherein:
   said multiplicity of spaced members includes a multiplicity of overlapping louvers.
10. The reactor of claim 1 wherein:
    said multiplicity of spaced members are overlapping.
11. A reactor which can generate a plasma in order to process a semiconductor wafer, said reactor comprising:
    a power transfer window;
    a reactor chamber;
    a chuck that is adapted to hold a wafer, which chuck is located in the reactor chamber;
    a shield which is located in the reactor chamber in the line of sight path between the chuck and said power transfer window in order to minimize the deposition of materials from a wafer onto said power transfer window;
    wherein said shield is located adjacent to said power transfer window; and
    said shield includes a multiplicity of spaced members adapted for deposition of materials thereon.
12. The reactor of claim 11 wherein:
    said shield is comprised of one of a conductor and an insulator.
13. The reactor of claim 11 wherein:
    said shield is a non-conductor which allows a magnetic field to continue through the shield.
14. The reactor of claim 11 wherein:
    said shield is comprised of one of aluminum, anodized aluminum, carbon, and carbon based compounds.
15. The reactor of claim 11 wherein:
    wherein said shield is comprised one of alumina, quartz, silicon, polytetrafluoroethylene, delrin, polyamide, and a support structure coated with an organic compound.
16. The reactor of claim 11 wherein:
    said shield is comprised of an organic compound.
17. The reactor of claim 11 wherein:
    said reactor is inductively coupled.
18. The reactor for claim 11 wherein:
    said multiplicity of spaced members includes a multiplicity of louvers.
19. The reactor of claim 11 wherein:
    said multiplicity of spaced members includes a multiplicity of overlapping louvers.
20. The reactor of claim 11 wherein:
    said multiplicity of spaced members are overlapping.
21. A reactor which can generate a plasma in order to process a semiconductor wafer, said reactor comprising:
    a power transfer window;
    a reactor chamber;
    a chuck that is adapted to hold a wafer, which chuck is located in the reactor chamber;
    a shield which is located in the reactor chamber in the line of sight path between the chuck and said power transfer window in order to minimize the deposition of materials from a wafer onto said power transfer window;
    wherein said shield is an integral part of said power transfer window;
    said shield includes a multiplicity of spaced members adapted for deposition of materials thereon; and
    wherein the multiplicity of spaced members includes a multiplicity of louvers.
22. A reactor which can generate a plasma in order to process a semiconductor wafer, said reactor comprising:
    a power transfer window;
    a reactor chamber;
    a chuck that is adapted to hold a wafer, which chuck is located in the reactor chamber;
    a shield which is located in the reactor chamber in the line of sight path between the chuck and said power transfer window in order to minimize the deposition of materials from a wafer onto said power transfer window;

wherein said shield is located adjacent to said power transfer window;

said shield includes a multiplicity of spaced members adapted for deposition of materials thereon; and wherein said multiplicity of spaced members includes a multiplicity of louvers.

23. A reactor which can generate a plasma in order to process a semiconductor wafer, said reactor comprising:

an electrode;

a reactor chamber;

a chuck that is adapted to hold a wafer, which chuck is located in the reactor chamber;

a shield which is located in the reactor chamber in the line of sight path between the chuck and the electrode in order to minimize the deposition of materials from a wafer onto said electrode;

wherein said shield is an integral part of said electrode; and said shield includes a multiplicity of spaced members adapted for deposition of materials thereon.

24. The reactor of claim 23 wherein:

said electrode is a first electrode;

a second electrode is located about and defines the periphery of said chamber; and a third electrode is located adjacent to the chuck.

25. A reactor which can generate a plasma in order to process a semiconductor wafer, said reactor comprising:

an electrode;

a reactor chamber;

a chuck that is adapted to hold a wafer, which chuck is located in the reactor chamber;

a shield which is located in the reactor chamber in the line of sight path between the chuck and the electrode in order to minimize the deposition of materials from a wafer onto said electrode;

wherein said shield is located adjacent to said electrode; and said shield includes a multiplicity of spaced members adapted for deposition of materials thereon.

26. The reactor of claim 25 wherein:

said electrode is a first electrode;

a second electrode is located about and defines the periphery of said chamber; and a third electrode is located adjacent to the second means.

* * * * *